United States Patent
Lacap et al.

(10) Patent No.: US 8,710,664 B2
(45) Date of Patent: Apr. 29, 2014

(54) WAFER-LEVEL CHIP SCALE PACKAGE

(75) Inventors: Efren M. Lacap, Hayward, CA (US); Subhash Rewachand Nariani, Pleasanton, CA (US); Charles Nickel, Hayward, CA (US)

(73) Assignee: Volterra Semiconductor Corporation, San Jose, CA (US)

( * ) Notice: Subject to any disclaimer, the term of this patent is extended or adjusted under 35 U.S.C. 154(b) by 8 days.

(21) Appl. No.: 13/361,716

(22) Filed: Jan. 30, 2012

(65) Prior Publication Data

US 2013/0026638 A1 Jan. 31, 2013

Related U.S. Application Data

(63) Continuation of application No. 12/844,649, filed on Jul. 27, 2010, now Pat. No. 8,106,516, which is a continuation of application No. 10/648,586, filed on Aug. 26, 2003, now abandoned.

(51) Int. Cl.
*H01L 21/48* (2006.01)
*H01L 21/52* (2006.01)
*H01L 29/40* (2006.01)

(52) U.S. Cl.
USPC ............ 257/772; 257/773; 257/778; 257/735

(58) Field of Classification Search
USPC .................................. 257/735, 772, 773, 775
See application file for complete search history.

(56) References Cited

U.S. PATENT DOCUMENTS

| | | |
|---|---|---|
| 3,401,126 A | 9/1968 | Miller et al. |
| 3,429,040 A | 2/1969 | Miller |
| T955,008 I4 | 2/1977 | Gregor et al. |
| 4,604,644 A | 8/1986 | Beckham et al. |
| 4,645,114 A | 2/1987 | Van Den Brekel et al. |
| 4,808,274 A | 2/1989 | Nguyen |
| 4,818,728 A | 4/1989 | Rai et al. |
| 4,851,966 A | 7/1989 | Roback et al. |
| 5,258,648 A | 11/1993 | Lin |
| 5,316,205 A | 5/1994 | Melton |
| 5,550,518 A * | 8/1996 | Mohwinkel ..................... 333/33 |
| 5,553,769 A | 9/1996 | Ellerson et al. |
| 5,558,271 A | 9/1996 | Rostoker et al. |
| 5,675,889 A | 10/1997 | Acocella et al. |
| 5,789,809 A * | 8/1998 | Joshi .............................. 257/704 |
| 5,854,513 A * | 12/1998 | Kim ............................... 257/737 |
| 5,918,792 A | 7/1999 | Stumpe et al. |

(Continued)

OTHER PUBLICATIONS

Figures 1, and 3-6 from "Oki technical Review", http://www.oki.com/en/otr/html/nf/, Feb. 19, 2003, 5 pages.

(Continued)

*Primary Examiner* — Jarrett Stark
*Assistant Examiner* — Nicholas Tobergte
(74) *Attorney, Agent, or Firm* — Lathrop & Gage LLP

(57) ABSTRACT

A chip scale package implements solder bars to form a connection between a chip and a trace, formed in a substrate, such as another chip or PCB. Solder bars are formed by depositing one or more solder layers into the socket, or optionally, depositing a base metal layer into the socket and applying the solder layer to the base metal layer. The geometry of a solder bars may be rectangular, square, or other regular or irregular geometry. Solder bars provide a greater utilization of the connectivity footprint and increase the electrical and thermal flow capacity. Solder bars also provide a robust connection.

10 Claims, 14 Drawing Sheets

(56) References Cited

U.S. PATENT DOCUMENTS

| | | | |
|---|---|---|---|
| 5,937,320 | A | 8/1999 | Andricacos et al. |
| 6,020,729 | A | 2/2000 | Stratakos et al. |
| 6,196,443 | B1 | 3/2001 | DiGiacomo |
| 6,225,795 | B1 | 5/2001 | Stratakos et al. |
| 6,278,264 | B1 | 8/2001 | Burstein et al. |
| 6,369,451 | B2 | 4/2002 | Lin |
| 6,372,622 | B1 | 4/2002 | Tan et al. |
| 6,374,487 | B1 | 4/2002 | Haba et al. |
| 6,400,126 | B1 | 6/2002 | Zuniga et al. |
| 6,433,614 | B1 | 8/2002 | You et al. |
| 6,445,169 | B1 | 9/2002 | Schultz et al. |
| 6,445,244 | B1 | 9/2002 | Stratakos et al. |
| 6,462,522 | B2 | 10/2002 | Burstein et al. |
| 6,498,467 | B1 | 12/2002 | Stratakos |
| 6,657,697 | B2 | 12/2003 | Yamate et al. |
| 6,742,248 | B2 * | 6/2004 | Wong et al. ............ 29/840 |
| 6,756,680 | B2 | 6/2004 | Jimarez et al. |
| 6,806,580 | B2 * | 10/2004 | Joshi et al. ............ 257/777 |
| 6,820,329 | B2 | 11/2004 | Fang |
| 6,977,396 | B2 | 12/2005 | Shen et al. |
| 7,057,292 | B1 * | 6/2006 | Elenius et al. ............ 257/779 |
| 2003/0157789 | A1 | 8/2003 | Tong et al. |

OTHER PUBLICATIONS

"Flip chip photographs of flip chip bumps, filp chip assemblies, flip chip interconnections", Flipchips dot com, http://www.flipchips.com/photos.html, Feb. 13, 2003, 3 pages.

"Flip-chip Packaging: a 32-Year-Old Infant Grows Up", Chip Scale Review Online, http://www.chipscalereview.com/issues/0701/fl_01.html, Jul. 2001, pp. 1-4.

"Flip-chip Packaging: a 32-Year-Old Infant Grows Up", Chip Scale Review Online, http://www.chipscalereview.com/issues/0701/fl_02.html, Jul. 2001, pp. 1-5.

"The Emerging Copper Revolution Will Impact ICs with Critical Dimensions 100nm", Chip Scale Review Online, http://www.chipscalereview.com/Issues/0301/techReport.html, Mar. 2001, pp. 1-3.

"Making Microchips", http://www.glenco.com/norton/n-instructor-/updates/2000/21100-7.html, Feb. 19, 2003, pp. 1-4.

"Process Defect Guides", ppm-monitoring.com, http://www.thepdfshop.com.uk/ppm/asp/wave.asp, Jul. 2, 2003, 4 pages.

"300mm Wafer Bumping", Technology Publishing—A division of Montgomery Research Europe Ltd., http://www.future-fab.com/documents.asp?grID=217&d_ID=1338, Jul. 1, 2003, 6 pages.

XICOR, "CSP Packaging Technology ("B" Package Option)", Revised Mar. 2003, 11 pages, XICOR, Milpitas, CA.

Duran, Dr. Hamit, "Chip-on-Foil: An Emerging Technology for Display Driver Electronics", Oct. 10, 2002, 33 pages, Phillips Semiconductors Zurich.

Fjelstad, Joseph, "Wafer Level Packaging of Compliant CSPs Using Flexible Film Interposers", HDI Magazine, Spring 1999, 6 pages.

"Flip Chip Packaging for SRAM", Copyright 1999, 2 pages, IBM USA.

U.S. Appl. No. 10/648,586.
U.S. Appl. No. 12/844,649.

* cited by examiner

FIG. 6
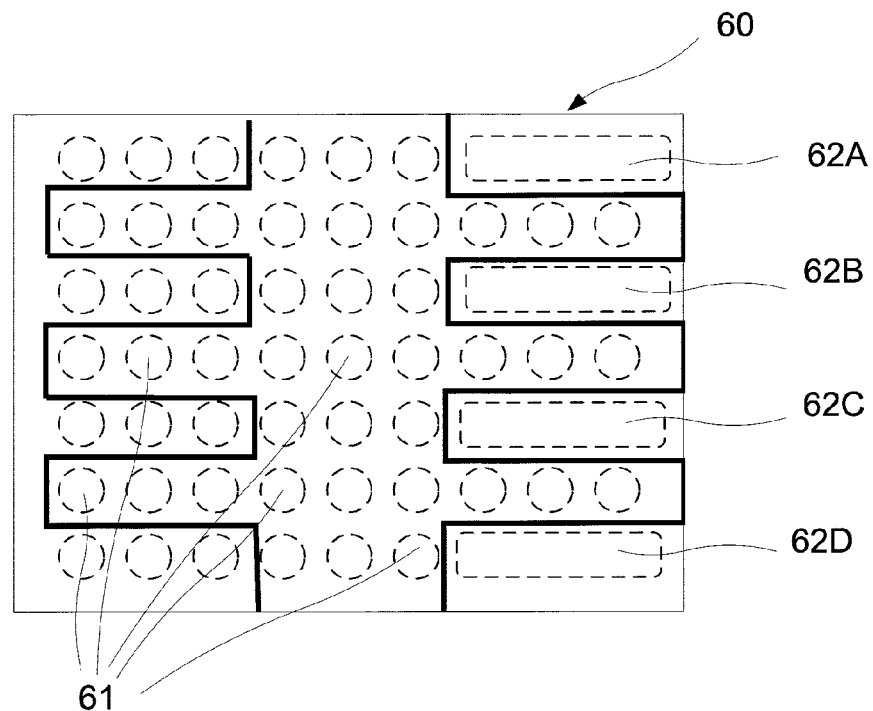
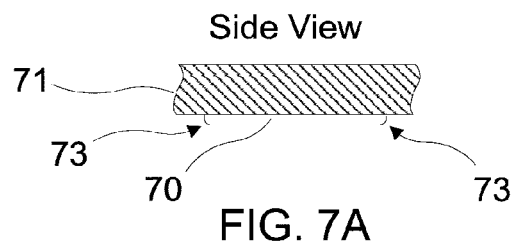
FIG. 7A
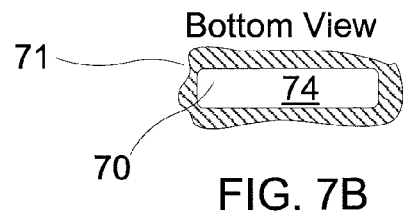
FIG. 7B

- 550mW (18%) savings at 25A
- 2A more current (10%) at 2W dissipation so that the package has the same width and depth as the chip, thereby reducing or eliminating wasted space. Utilizing a package saves space and weight when compared to face-up chip placement utilizing wire connections between a chip and PCB.

WAFER-LEVEL CHIP SCALE PACKAGE

CROSS REFERENCE TO RELATED APPLICATIONS

This application is a continuation of U.S. patent application Ser. No. 12/844,649, filed Jul. 27, 2010 now U.S. Pat. No. 8,106,516, which is a continuation of U.S. patent application Ser. No. 10/648,586, filed Aug. 26, 2003 now abandoned. Both of the above-mentioned applications are incorporated herein by reference.

BACKGROUND

1. Field of the Invention

The disclosure herein pertains to materials and methods for soldering one electrical component to another, for example, in the use of specially prepared solder films to connect chips and other circuit components to printed circuit boards (PCBs) or other substrates.

2. Description of the Related Art

A wafer-level chip scale package (package) is an integrated circuit assembled at the wafer level. The package provides a physical interface between each pad of a chip and a corresponding circuit connection, e.g., a PCB, interposer, or another chip in a chip-on-chip installation. Intra-package connections may extend straight and vertically through the package from the chip to the PCB so that the package has the same width and depth as the chip, thereby reducing or eliminating wasted space. Utilizing a package saves space and weight when compared to face-up chip placement utilizing wire connections between a chip and PCB.

Solder balls may be used to connect the chip to the PCB, for example, using automated 'flip-chip' processing equipment as shown in U.S. Pat. No. 5,918,792 issued to Stumpe et al. Generally, each solder ball connects a chip to conductive traces on the PCB. The chip contains a socket that is made of adhesive and conductive materials bonded to the wafer in an area of the chip often referred to as the pad. Each socket retains a selectively placed preformed solder ball as an aid to solder-coupling the chip with the substrate. The pad is a conductive area on the wafer where either conductive material is applied to the chip or ion implantation renders the wafer conductive. Although silicon wafers are most commonly used, other materials such as gallium arsenide are also utilized.

With preformed solder balls positioned on the socket and the chip positioned on the PCB or other circuit connection, the preformed solder balls are heated to at least their melting point. Adhesion forces pull the molten solder over the socket and circuit connection to establish an electrical contact between the chip and the circuit connection. The process of melting the preformed solder ball to form an installed solder ball that couples the socket and the circuit connection is known as "reflow." The socket resides in electrical contact with conductive traces on the PCB, and these traces operably connect the chip to other PCB components.

Pads include a socket area that may contain a solder receptacle and contact materials. Other portions of the pad may be protected by passivation and polymer layers. As there is difficulty in directly bonding solder to silicon or other wafer materials, the contact materials on the socket are often formed by an under-bump metallization (UBM) layer and an adhesion layer. The adhesion layer, e.g., aluminum, aluminum-copper, connects the pad to the UBM, which is capable of bonding with solder. The solder receptacle may be coextensive with the surface of the UBM, such that the socket boundaries are defined by the surface of the UBM where the perimeter of the socket is formed by voids in passivation and polymer layers. The passivation layer is a dielectric and may protect embedded circuits from contamination or physical damage. The passivation layer may, for example, be formed of polysilicon or oxinitride. The polymer layer provides additional dielectric properties and masks the package for etching, which exposes the UBM and forms the sockets. In some applications, the UBM is applied to the entire void formed in the passivation and polymer layers as a lining in the etched void. In such an application, the socket is defined by the exposed surface of the UBM.

After application of the UBM, the passivation layer may be applied to the pad and etched to form a plurality of openings exposing the UBM layer. A polymer layer, for example a benzocyclobutane (BCB) layer, is next applied to the passivation layer. The BCB layer is also etched to form a plurality of openings, each corresponding to, and aligning with, an opening in the passivation layer. Together, the adhesion layer, UBM layer, and openings in the passivation and BCB layers form a cavity or socket that may be used to contact an installed solder ball.

Prior art packages are typically assembled by placing preformed solder balls at selected socket locations on the chip. The chip is then placed in a predetermined positional alignment such that each preformed solder ball contacts the socket where it resides and conductive traces on the PCB or other circuit connection. The preformed solder balls are reflown to complete the connection between the trace and the UBM layer. Optionally, an underfill resin is applied to the space between solder balls. The resin provides shock-load tolerance beyond the limits of the solder balls alone. The chip may be reinforced by attaching the solder balls to a ceramic carrier, such as an interposer with conductive vias, for example, to enhance rigidity when the PCB is too flexible or as a manufacturing aid to increase solder ball installation alignment tolerances. The interposer is then attached to the PCB.

Packages often have different sockets that connect, for example, with low-current, data (I/O) circuits and high-current, power circuits. Both I/O and power circuits utilize solder ball connections. A single solder ball is often inadequate to carry the load of power circuits. Therefore, the load of a power circuit may be shared across a plurality of electrically parallel solder ball connections. Some installations may require additional solder ball connections to provide adequate heat dissipation from the chip.

Although the prior art solder-ball package provides many benefits, problems remain. Power connections require a greater current capacity compared to I/O connections. As a result, these high-current connections may require multiple solder balls to handle the required current flow. The use of multiple solder balls imposes additional design constraints. For example, the footprint of multiple solder balls must accommodate the plurality of solder balls and the unused space between each solder ball, e.g., the space between each socket. The resulting package is overly large, and the connection footprint contains wasted space. Additionally, the relatively small cross-sectional area of solder balls limits the chip's ability to transfer heat. Heat may accumulate within a chip and degrade performance. Safe operating temperatures are more easily exceeded, and this circumstance may impose associated operational constraints affecting frequency, current, or voltage. If thermal effects are unmitigated, damage to the chip may occur.

Incomplete reflow and stress cracking exacerbate the problems associated with the limited cross-sectional area of solder balls. As chip processing activity fluctuates, associated variable power draw and near-constant electrical resistance produce a corresponding fluctuation in heat, resulting in thermal expansion and contraction of the package and components therein. These fluctuations, known as thermal cycling, create stresses on the connections, for example, because materials of the package do not have the same coefficients of thermal expansion. Thermal stress may lead to fatigue cracks or to complete breakage of contact with a solder ball. Additionally, incomplete reflow further compounds the stress. Incomplete reflow occurs when a preformed solder ball melts to form a solder ball but does not achieve complete coverage of the UBM layer or other connection area. The resulting incomplete connection has a diminished cross-sectional area, which provides a further diminution of performance and an increased probability of cracking and breakage.

SUMMARY

Certain features in the present disclosure may overcome certain problems outlined above by providing, for example, systems and methods of chip-to-socket connection. Pre-formed thick-film solder bars may have increased thermal and electrical connectivity, increased tolerance to stress, and a decreased package footprint. These packages may achieve greater performance, reliability, and efficiency.

In one embodiment, a solder bar is provided. The solder bar connects at least one socket with a conductive trace, for example on a PCB or other circuit connection. The socket is defined on a chip and provides a contact surface to at least one of the chip's circuit conduits. The socket geometry accommodates the geometry of the installed solder bar. Optionally, the solder bar may form various geometries providing the desired connection area and footprint. For example, if a chip and/or substrate design provides for an "L" shaped power connection, the socket and solder bar may have a complementary "L" shape.

Solder bars offer a greater contact surface area over the same connectivity footprint, as compared to an equivalent footprint of prior art solder balls. Chip performance may be increased by exploiting additional current and heat flow capacities over this surface area, as compared to prior solder ball connections. Furthermore, the solder bars may provide stronger connections having greater tolerance to stress, such as thermal cycling stresses. Accordingly the package of the present disclosure may have improved durability, reliability, and/or operational parameters.

In another embodiment, solder bars form geometries other than a linear bar-shape, such as rectangle or "I" geometries. The solder bar may form any contiguous geometry providing a single electrical potential. Solder bar geometry may be, for example, "I," "E," "U," ring, and/or square, or any other regular or irregular geometry that is complementary to a chip pad design. The ability to pre-form solder simplifies the task of implanting solder bars for chip-bonding processes.

In one embodiment, the solder bar has a base metal layer coated with a solder layer. The base metal may be an alloy, layered, and/or doped composition of, for example, copper, gold, platinum, palladium, silver, aluminum, tin, bismuth, vanadium, tungsten, titanium, or lead. As an option, the base metal layer may be omitted increasing resistance and may prevent the solder from forming into clumps, by action of adhesion forces during reflow. The footprint geometry of the solder bar is defined by a socket, having dimensions complementary to one bump, for retaining solder during reflow.

The height of the solder bar is determined by the combined height of the base metal layer, if used, and the solder layer. The base metal layer may be comprised of zero or more layers and the solder layer may be one or more layers. By way of example, solder bars may be formed of different thick film layers, each layer having a different melting temperatures. Forming the solder layers and base metal layers may be accomplished, for example, by electroplating the socket. Other methods may be employed to form the base metal layer and/or solder layer, such as liquid chemical deposition, chemical-vapor deposition, sputtering, or screen printing. The thickness of each of the base metal layer or solder layer, as well as the composition thereof, is a matter of design where the thicknesses are adjusted to meet connection and processing requirements. Some of the determinate factors for the solder bar height and materials include providing sufficient solder volume to facilitate complete wetting of the connection surfaces during reflow, providing sufficient solder volume to bridge the gap between connection surfaces without inducing unwanted resistance, mitigation of parasitic capacitance when using heterologous conductors, and limiting the solder volume to avoid overflow and/or inadvertent contact with another circuit.

Solder materials and techniques for their deposition are known, for example, as shown in U.S. Pat. No. 5,326,453 issued to Endicott et al. Solder characteristics may be adjusted by forming alloys of various materials, such as tin, silver, gold, manganese, copper, lead, and bismuth, to provide the desired characteristics of the connection. Examples of solder design factors include melting point, resistance, thermal conductivity, flux requirements, and flow rate. The melting point for the solder layer is generally greater than that of the melting point for the base metal layer.

In one embodiment, a method is provided for constructing a solder bar. First, a pad is formed with a socket to accept the solder bar. The socket geometry is in essence a planar face on the pad onto which has been deposited an adhesion layer and an UBM layer, or another such layer as may be desirable to facilitate solder bonding and electrical contact with the pad. The socket may be formed on a region of the pad where, for example, passivation and BCB materials have been removed or where such materials have not been deposited. The socket differs in geometry from sockets designed to accept solder balls because no dimple or recess for retaining the solder ball is required. With the socket formed to an appropriate geometry for accommodating a solder bar of the type described above, a base metal, such as copper, is optionally but preferably deposited directly onto the UBM layer. Deposition is preferably made by electroplating, but may be augmented or implanted by screen printing or other deposition processes. The thickness of the base metal is a matter of connection design requirements, and the base metal may sometimes be omitted, but the thickness is generally that of a thick film. A thickness in the range from 13,000 to 17,000 Å is suitable for many design requirements. Next, a solder layer is electroplated onto the base metal, or directly to the UBM if the base metal is omitted. Sputtering, liquid chemical deposition, chemical vapor deposition, or screen printing may be used as alternatives to electroplating the solder. The application of solder and/or a base metal layer may include an overage and a subsequent removal of the overage by grinding, shaving, etching, or other removal processes. As an option, the solder layer is placed in contact with a trace and reflowed to complete the connection between a pad and trace.

Problems associated with prior art preformed solder ball placement and reflow may be reduced or eliminated. For example, adhesion forces of molten solder may be increased by the presence of a base metal layer, e.g., by capillary action, whereas in solder ball placement such forces may be insufficient to completely wet large or non-circular connection surfaces. By implementing the solder bar construction methods, disclosed herein, the base metal layer and/or solder layer may be uniformly applied to essentially any socket geometry.

BRIEF DESCRIPTION OF THE DRAWINGS

FIG. 6 shows an exemplary PCB for use with a combination of solder balls and solder bars;

FIG. 7A and FIG. 7B show an exemplary solder bar;

DETAILED DESCRIPTION OF THE DRAWINGS

Figure 1:
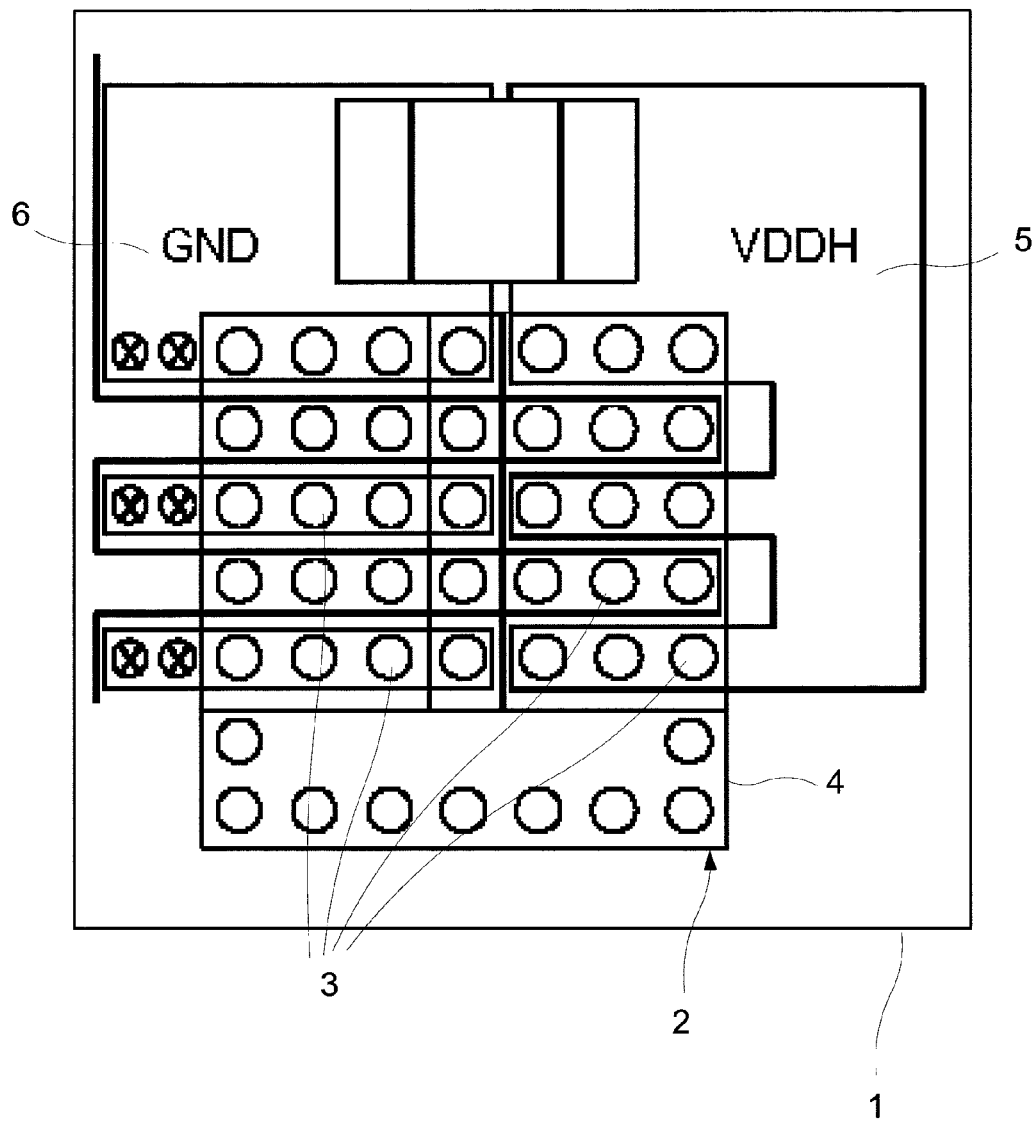
FIG. 1 shows a PCB mounted prior art chip scale package.

FIG. 1 shows PCB 1 with a prior art chip scale package 2 mounted thereon. Package 2 is a "Standard CSP," which is shown in midsectional top view to reveal a plurality of solder ball connections 3. Solder ball connections 3 attach chip 4 to power plane 5 and ground plane 6, contained on PCB 1. Current flows through power plane 5, a subset of solder ball connections 3 to chip 4, switches within chip 4, another subset of solder ball connections 3, optionally through other circuitry (not shown), and ground plane 6.

Figure 2:
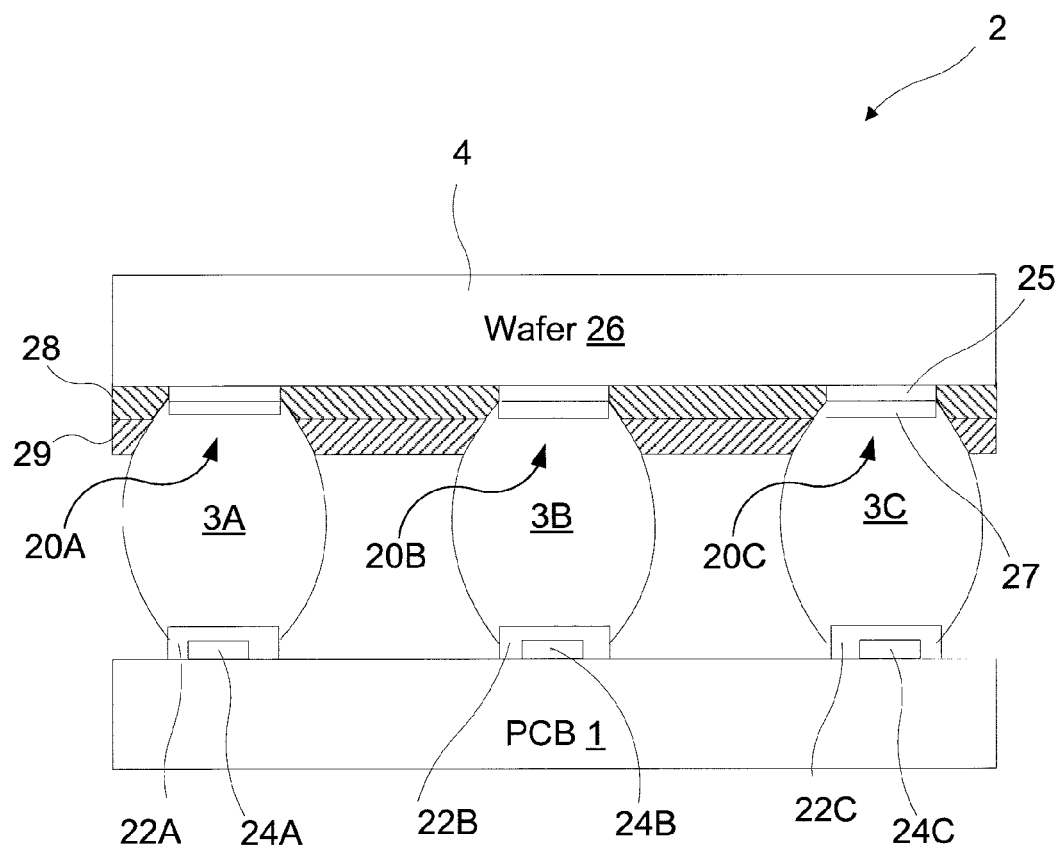
FIG. 2 shows a side view block diagram of a prior art chip scale package.

FIG. 2 shows a side view, of the prior art chip scale package 2. Chip 4 has sockets 20A-20C. Solder balls 3A-3C are interposed between sockets 20A-20C and conductive PCB contacts 22A-22C to form respective current pathways between PCB 1 and chip 4. The conductive PCB contacts 22A-22C are in electrical contact with PCB wiring traces 24A-24C connecting chip 4 with other components (not shown) of PCB 1. The sockets 20A-20C are each formed to include, for example, a conductive pathway formed by an adhesion layer 25 bonded to wafer 26 and UBM 27. BCB layer 28 and passivation layer 29 define sockets 20A-20C in areas apart from UBM 27.

Figure 3:
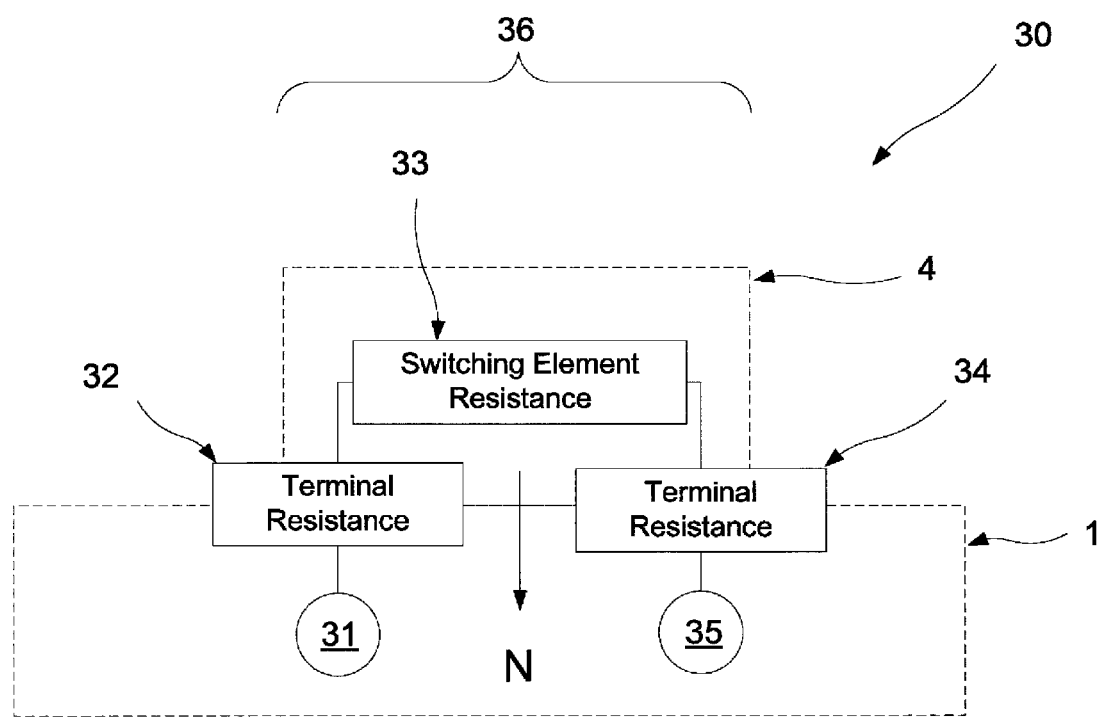
FIG. 3 shows a block diagram of one electrical circuit through a package.

FIG. 3 shows a block diagram of electrical circuit 30 which may for example be used in package 2 as shown in FIG. 2. Circuit 30 may be one of many such circuits connected to chip 4. Resistance is encountered as current flows through first circuitry 31 on PCB 1, a first terminal 32 (e.g., conductive PCB contact 22A, solder ball 3A, and socket 20A), switching element(s) 33 on chip 4, second terminal 34 (e.g. conductive PCB contact 22B, solder ball 3B, and socket 20B), and second circuitry 35 on PCB 1. Large currents, which for example are common with power circuits, generate a large amount of heat when flowing through first and second terminals 31, 35. Heat generated in switching element 33, and elsewhere in the chip 4, must be dissipated as flux N. Heat dissipation is significantly dependent on the chip's mechanical connection to first and second terminals 31, 35.

According to the instrumentalities described herein, improved electrical conductivity is provided to circuit 30 and improved thermal conductivity is provided to the chip containing switching element 33 by implementing solder bars to establish first and second terminals 31, 35. Advantages in current or power throughput are obtained and dissipation of heat and flux N is improved by providing first and second terminals 31, 35 with larger contact surface area, whereas the footprint of chip 4 over area 36 may also be advantageously decreased.

Figure 4:
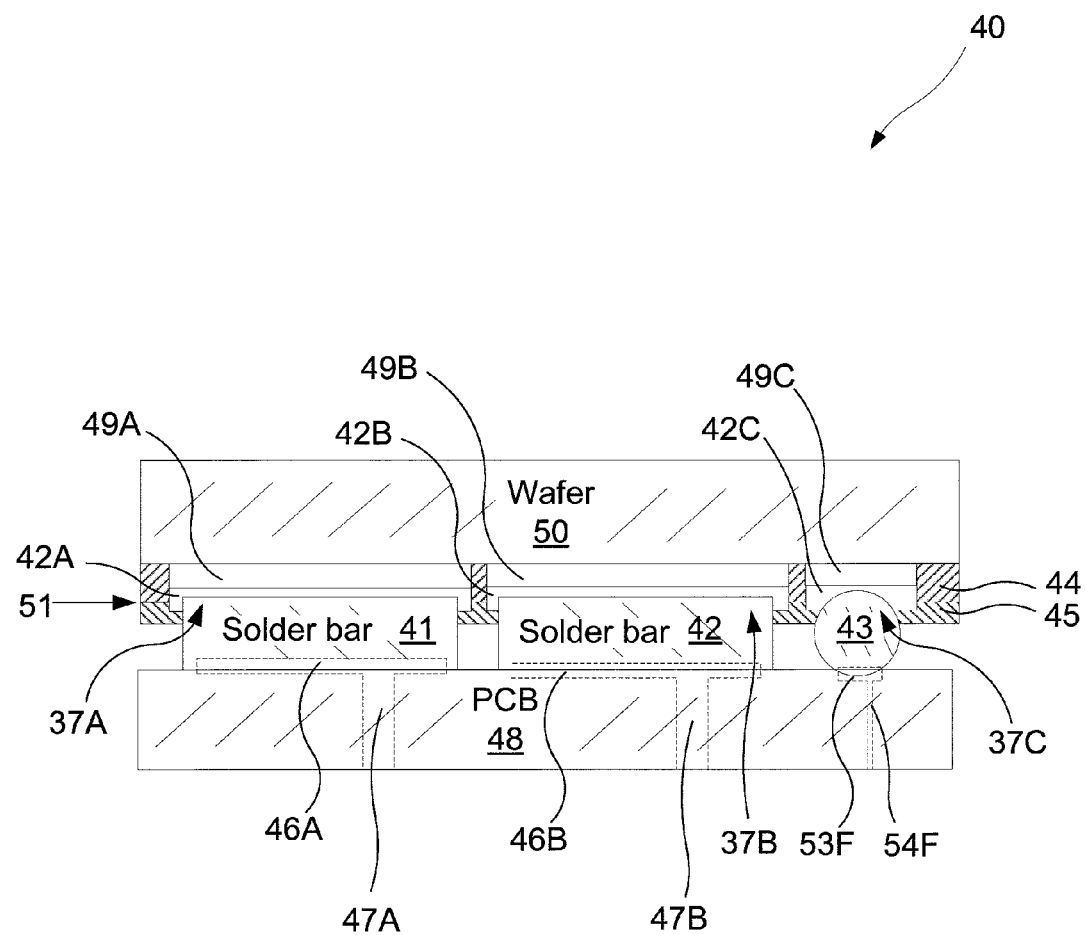
FIG. 4 shows a side view block diagram of an exemplary wafer package with solder bars.

FIG. 4 shows a schematic midsectional elevation view of a wafer package 40 incorporating solder bars 41, 42. FIG. 4 is taken across line A-A of FIG. 5. Solder bars 41, 42 form respective power circuit connections. Solder ball 43 provides data signal or I/O circuit contact and may optionally be used in combination with solder bars 41, 42 or replaced by an additional solder bar. Passivation layer 44 and BCB layer 45 provide a non-conductive base for each of sockets 37A, 37B, 37C. Sockets 37A and 37B have dimensions complementary to solder bars 41, 42 for retention of solder bars 41, 42 therein. PCB 48 may contain traces 46A-B and vias 47A-B to electrically connected additional circuitry (not shown) on PCB 48. Optionally, PCB 48 may be another chip, such as a chip-on-chip configuration, or ceramic interposer.

Sockets 37A, 37B may be formed by multiple processes; for example by screen printing the adhesion layers 49A, 49B, onto wafer 50, followed by liquid or vapor deposition of passivation layer 44 to a uniform thickness at interface 51. BCB layer 45 is applied through a mask to passivation layer 44. The masked application of BCB layer 45 leaves areas of passivation layer 44 exposed, including the areas of the passivation layer covering adhesion layers 49A-C. Lithographic etching of passivation layer 44, where passivation layer 44 is unprotected by the masked application of BCB layer 45, removes the exposed portions of passivation layer 44. As a result, adhesion layers 49A-C are exposed and available to receive sputtered UBM layers 42A-42C. A discrete and isolated electric pathway is formed, for example, between wafer 50, adhesion layer 49A, UBM layer 42A, solder bar 41, trace 46A, and via 47A.

A data circuit 53 contacts to solder ball 43, which is optionally replaced by a solder bar (not shown).

Figure 5:
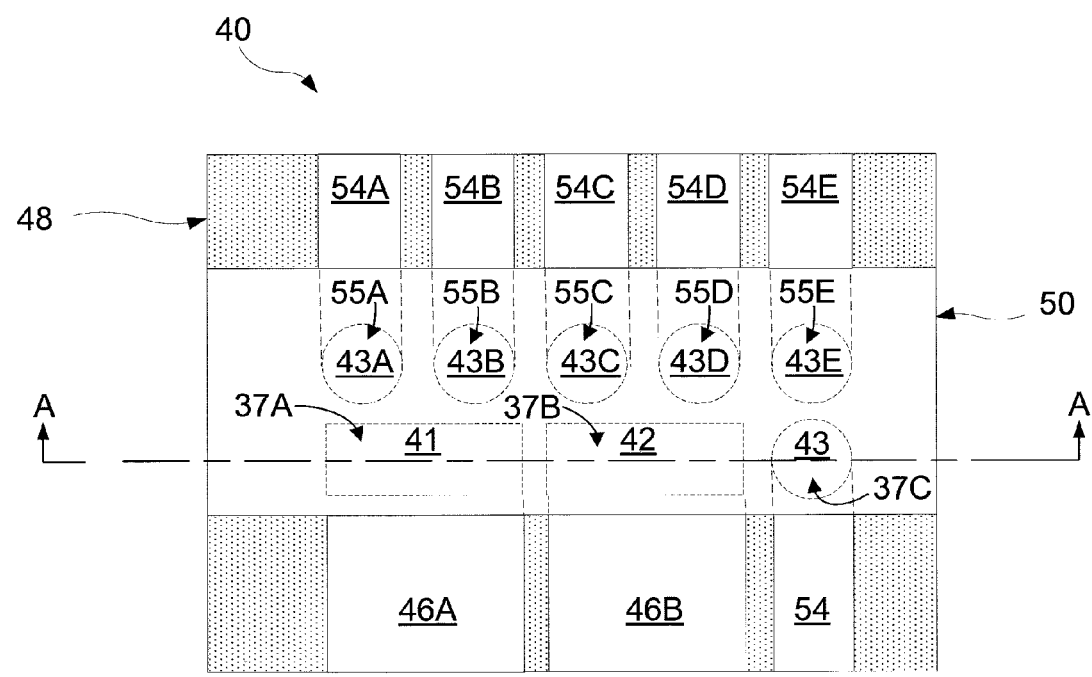
FIG. 5 shows a top view block diagram of an exemplary wafer package with solder bars.

FIG. 5 is a top view of wafer package 40. Solder balls 43, 43A-E connect PCB 48 to data traces 54, 54A-E and sockets 37C, 55A-E on wafer 50. Power traces 46A, 46B, solder bars 41, 42 and sockets 37A, 37B form respective power circuits. One or more of the solder balls 43, 43A-E may optionally be replaced by solder bars to accommodate greater current and/or heat flow, improve package reliability, or to simplify the design and/or manufacture of wafer package 40.

FIG. 6 is a top view of PCB 60, which may be used with a combination of solder balls and solder bars. PCB 60 contains a plurality of semi-spherical solder ball traces 61 and rectangular solder bar traces 62A-D. Traces 62A-D may be formed by known processes, such as screen printing or stenciling of gold, copper, aluminum, or other conductor materials onto PCB 60. Solder bar traces 62A-D and solder ball traces 61 each present solder-bonding surfaces. It will be appreciated that the elements of PCB 60 may be arranged and deployed for use as PCB 48 shown in FIG. 5, or in any other manner that is effective to implement circuit requirements on PCB 60.

FIG. 7A is a side view of solder bar 70, which is suitable for use with PCB 60 (FIG. 6), for example, for bonding with one of sockets 62A-62D. Chip 71 bonds with solder bar 70. Although solder bar 70 is generally shown as a rectilinear shape, it may have radius corners 73 resulting from electrodeposition processes. Solder bar 70 is also substantially planar rectilinear in the sense that the height dimension extends through a thick film that is substantially planar when the height dimension is several times less, e.g., 4×, 8×, 12×, 16×, less than the width or depth dimension. Solder bar 70 may also be planar curvilinear. FIG. 7B is a bottom view of the solder bar 70. Surface 74 forms a bonding surface when installed, for example, to trace 62D (FIG. 6). Solder bar 70 is, for example, optionally used as solder bar 41 or 42 (FIG. 4).

Figure 8:
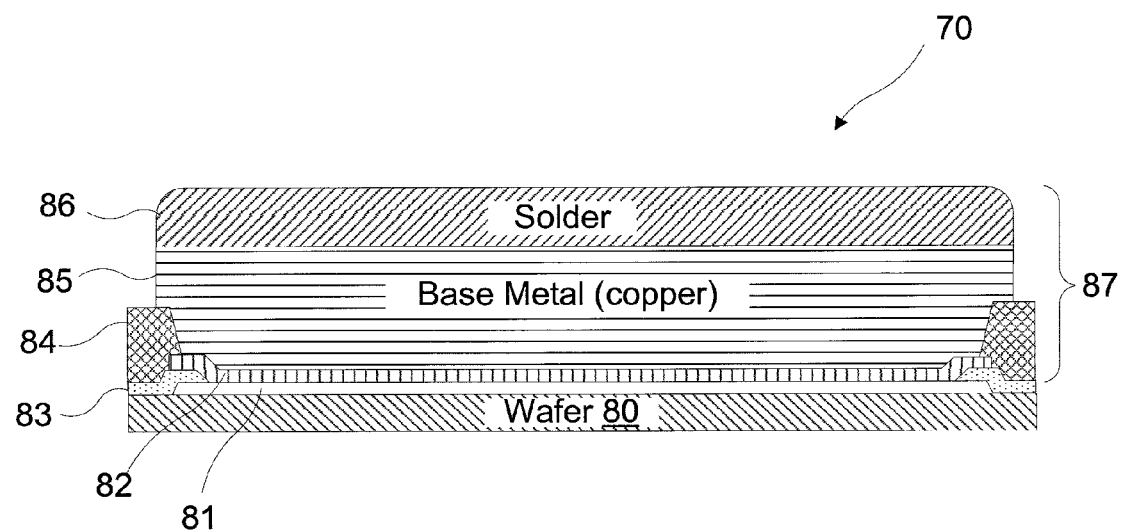
FIG. 8 shows a cross-section of an exemplary solder bar.

FIG. 8 is a midsectional view providing additional detail with respect to solder bar 70 (FIG. 7). Wafer 80 may be any type of semiconducting wafer, such as silicon. In these contexts, wafer 80 may be an integrated circuit chip or any other solid state electronic component involving the use of a wafer. Adhesion layer 81 is in contact with wafer 80, and is bonded to UBM material 82. UBM material 82 substantially defines the footprint of solder bar 70 on wafer 80. Passivation layer 83 and BCB layer 84 substantially define the areal extent of solder bar 70 and may be deposits of certain processes, such as silicon dioxide crystal growth or polysilicon coating. Solder bar 70 may be entirely solder or optionally contain a base metal 85 as, for example, copper, gold, silver, aluminum, lead, tin, or other metal. Copper is especially preferred. Solder 86 is in substantially continuous contact with base metal 85, or UBM layer 82 if base metal 85 is omitted. The height 87 of solder bar 70 may be any height, where useful heights for most applications range from 50 μm to 300 μm, and are more typically between 100 μm and 200 μm. The base metal 85 and solder 86 constituents of solder bar 70 may be deposited by electrodeposition processes, where heights of the respective layers may be supplemented by screen printing or evaporative processes, as needed.

Figure 9:
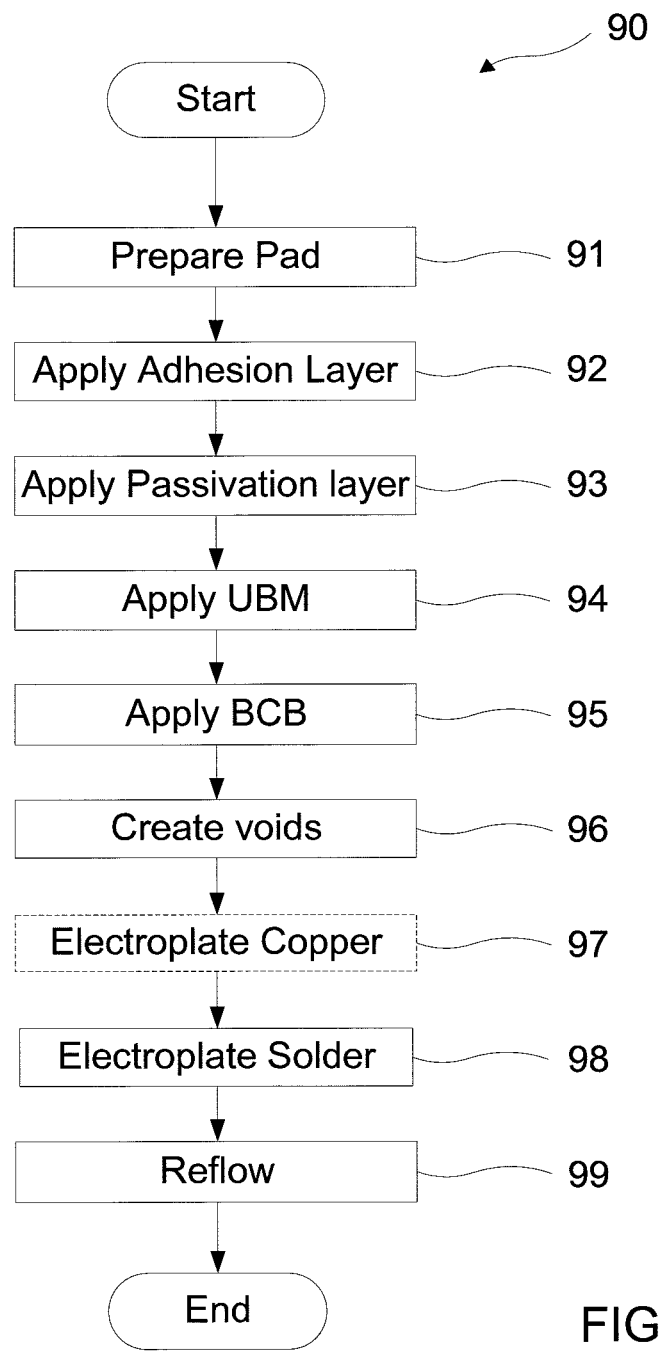
FIG. 9 shows an exemplary process for manufacture of solder bars.
Figure 10A:
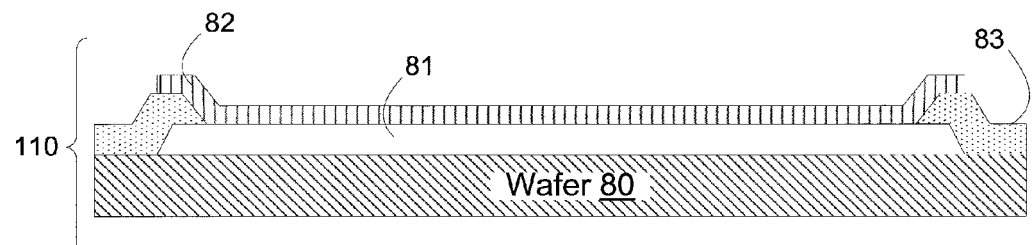
FIG. 10A-E show one formation of an exemplary solder bar in a socket.
Figure 10B:
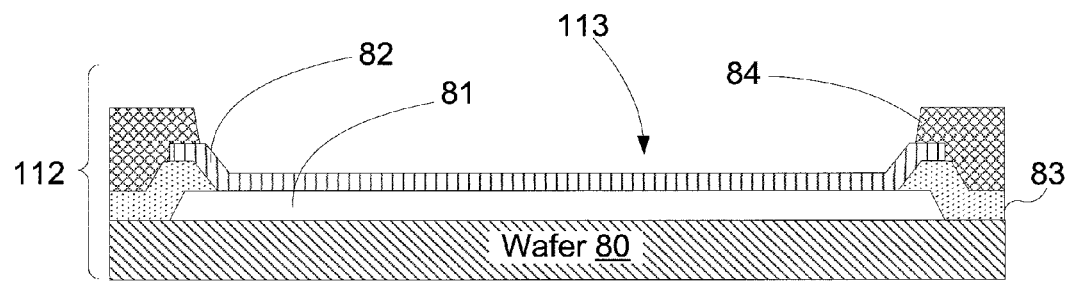
Figure 10C:
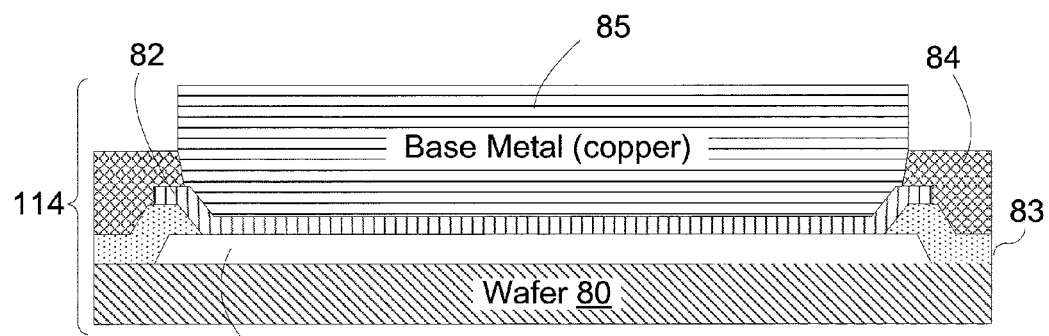
Figure 10D:
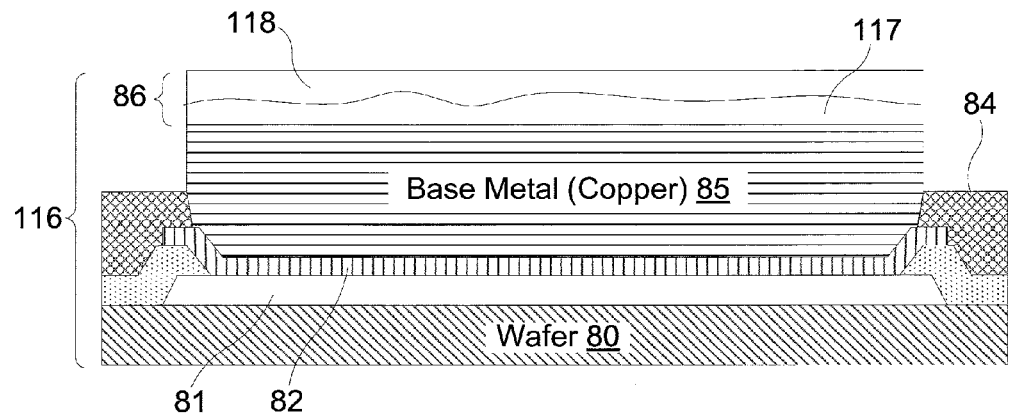
Figure 10E:
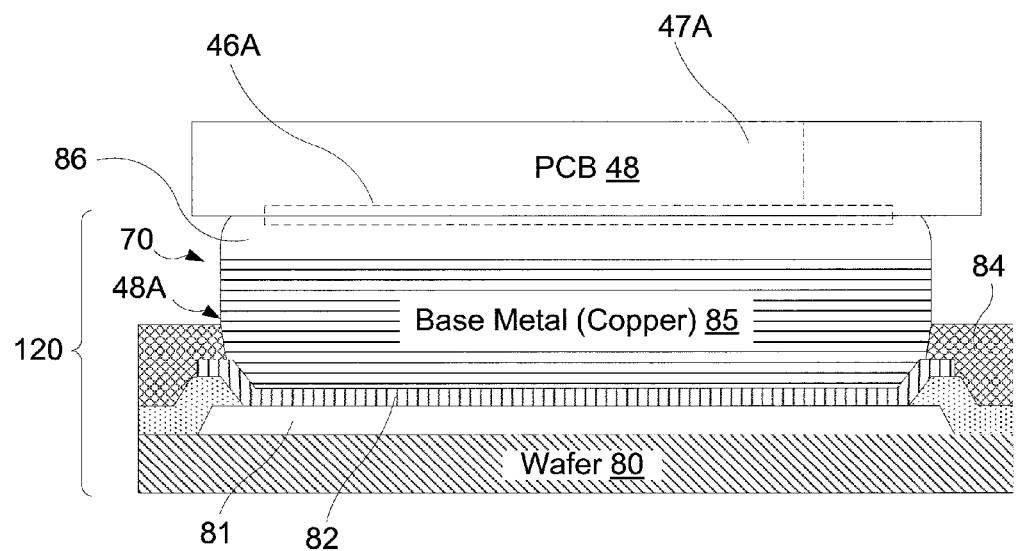

FIG. 9 shows exemplary process 90 for manufacture of a solder bar, such as solder bar 70 (FIG. 7). A chip is prepared 91 for incorporation into a package having electrical contact pads operable to receive a conductive adhesion layer. An adhesion layer, e.g., aluminum, is applied 92 to the pad of the chip. The adhesion layer application 92 may entail screen printing or other methods of application and may include the application of nickel, vanadium, copper, titanium, tungsten, or aluminum. A passivation layer, e.g., polyimide, silicon nitride, silicon oxide, polysilicon, or oxinitride, is applied 93, for example, by chemical vapor deposition and covers the chip and adhesion layers. A UBM layer, e.g., aluminum, nickel-vanadium, copper, titanium, tungsten, vanadium, tin, gold, silver, lead or titanium-tungsten, is applied 94 substantially to the adhesion layer. The UBM layer may be applied 94 by etching, photolithography, sputtering, or other method of application. A BCB layer is applied 95 through a mask, thus preventing application to areas where the passivation layer is to be removed, such as areas covering the adhesion layers. Voids are created 96 by exposing the chip to lithography which softens the areas of the passivation layer not protected by the BCB layer. The softened passivation layer is washed away exposing the adhesion layer. As a matter of design choice, a base metal, such as copper, is electroplated 97 onto the UBM layer. A solder layer is then electroplated 98 onto the base metal, if provided, or if the base metal is omitted, electroplated 98 directly to the UBM layer. It will be appreciated that one or more of the deposition steps may be eliminated, for example, where passivation is not required or elimination of the UBM if the base metal or solder is capable of bonding directly to the adhesion layer.

Base metal application 97 or solder application 98 may, for example, be accomplished by electroplating in an electrochemical reactor using standard plating solutions. After step 98, process 90 has assembled the solder bar. Installation of the solder bar may place a trace of a substrate in contact or in close proximity with the solder bar and heated to reflow 99 the solder bond with the trace and complete the connection.

FIGS. 10A-E illustrate stages of solder bar manufacture. Structure 110 is prepared by application of an adhesion layer 81, passivation layer 83, and UBM layer 82 (FIG. 9, steps 92-94). These layers may be etched in a predetermined pattern. Next, structure 112 shows the addition of BCB 84 to complete the definition of socket 113 (FIG. 9, step 95). Structure 114 shows deposition of base metal 85 applied to UBM layer 82 (FIG. 9, step 97). Structure 116 shows deposited solder 86 on base metal 85 (FIG. 9, step 98). Optionally, a plurality of solder layers having different material properties may be deposited, e.g., as layers 117, 118 where layer 117 may have a lower melting point or different composition than does layer 118. For example, layer 117 may have an alloy having different percentages of lead and silver than does solder layer 118.

Structure 120 shows solder 86 after melting during reflow (FIG. 9, step 99), where wafer 80 is positioned in place of wafer 50 and solder bar 70 stands in place of solder bar 41 in socket 48A.

Figure 11:
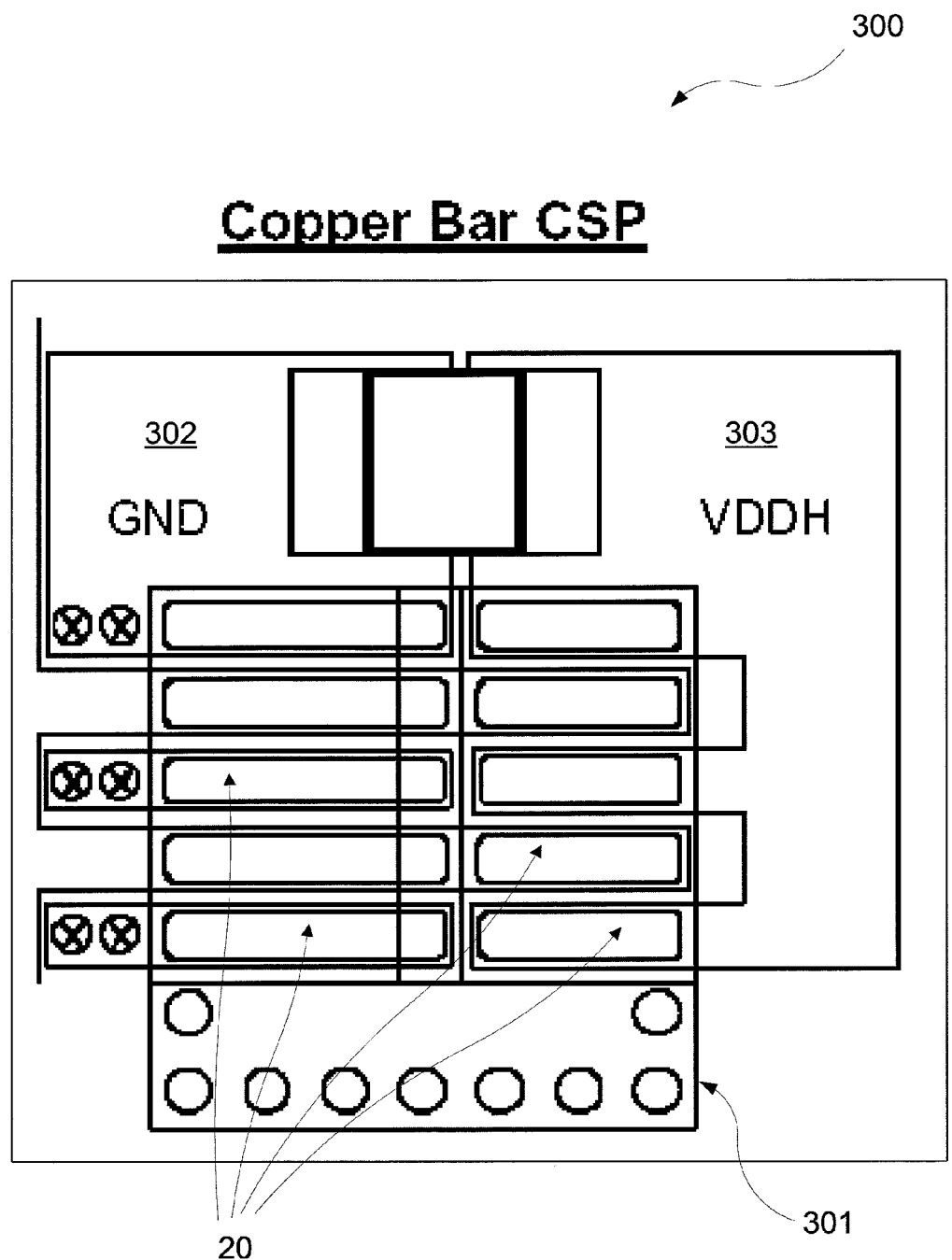
FIG. 11 shows the layout of two packages for benchmarking and comparison of the performance of similar packages, one utilizing solder bars and another utilizing only solder balls.

FIG. 11 depicts one layout 300 of package 301, which was used in benchmark performance comparison testing against the standard ball-grid package 2 shown in FIG. 1. The two packages 2, 301 differed only in the implementation of plural solder bars 70 (FIG. 7) versus solid balls 3 (FIG. 1). Package 301 implements solder bars 70 with a copper base metal layer applied to the socket, as shown in FIG. 8.

The objective of the comparison was to determine performance differences between a standard chip scale package having solder ball connections 3 and package 301 having plural solder bar 70 connections. Solder bar 70 connections utilized a copper base metal layer with solder applied to the copper (FIG. 8). The connectivity footprint of solder ball connections 3 and solder bar 70 connections are substantially identical, however, comparative data shows that solder bars 70 provide improved utilization of the same footprint.

Figure 12:
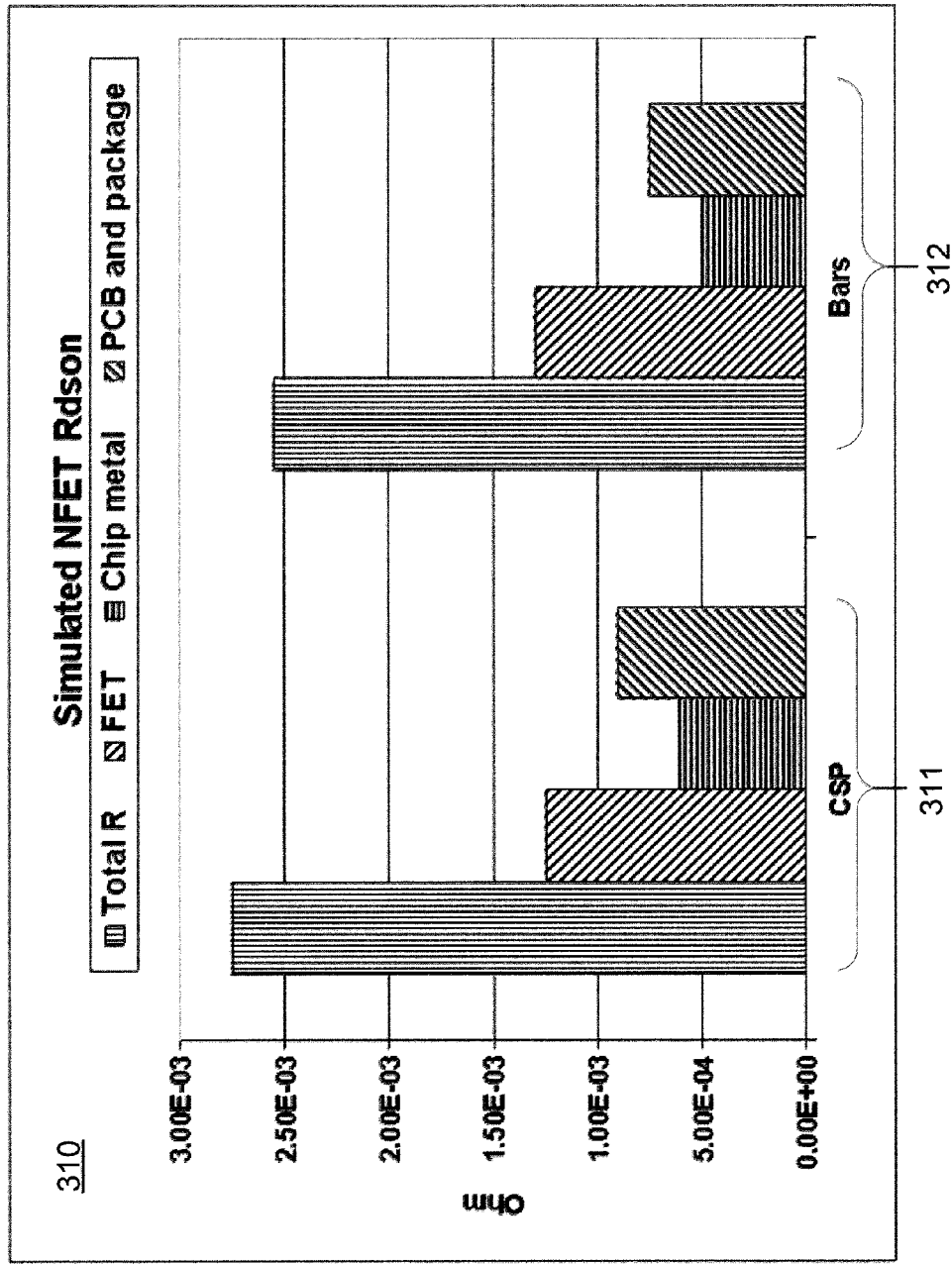
FIG. 12 shows a chart depicting the results of a Simulated NFET Rdson benchmark.

FIG. 12 shows chart 310 depicting the comparative simulated NFET Rdson ("n" Field Effect Transistors On-Resistance) benchmarks from layouts 300 A and B (FIG. 11). The simulated NFET Rdson benchmark results for solder ball package 2 are represented by "CSP" group 311 and the results for solder bar package 301 are represented "Bars" group 312. Solder bar package 301 produced a 10-15% improvement in Rds over solder ball package 5.

Figure 13:
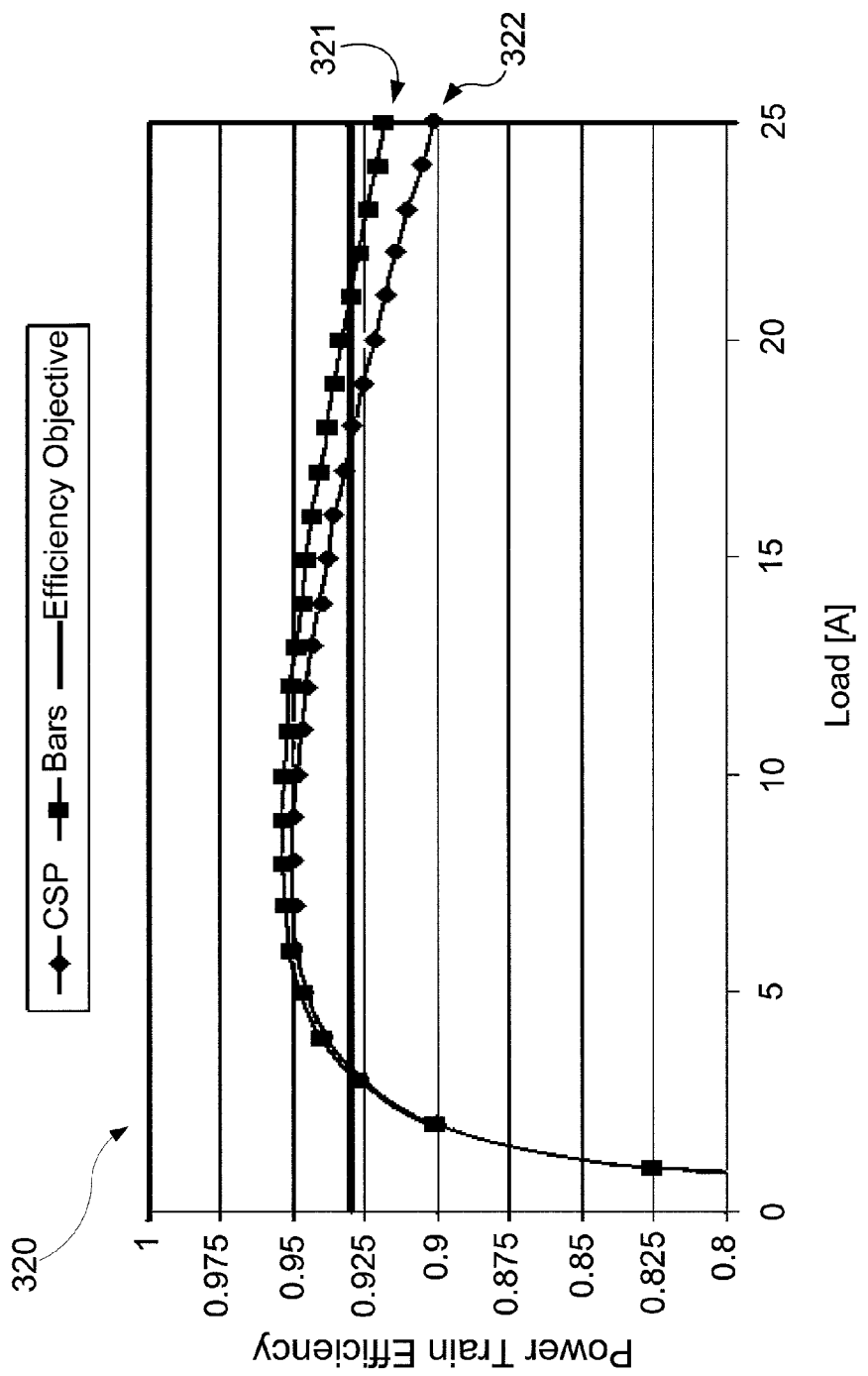
FIG. 13 shows a chart depicting the results of a load efficiency benchmark.

FIG. 13 shows chart 320 depicting the comparative load efficiency benchmarks from layout 300 A and B (FIG. 11). The load efficiency benchmark results for solder ball package 2 are represented by "CSP" line 322 and the results for solder bar package 301 are represented by "Bars" line 321. Solder bar package 301 produced a 1.6% higher efficiency at 25A and 3.5A more current at comparable 93% efficiencies in comparison to solder ball package 2.

Figure 14:
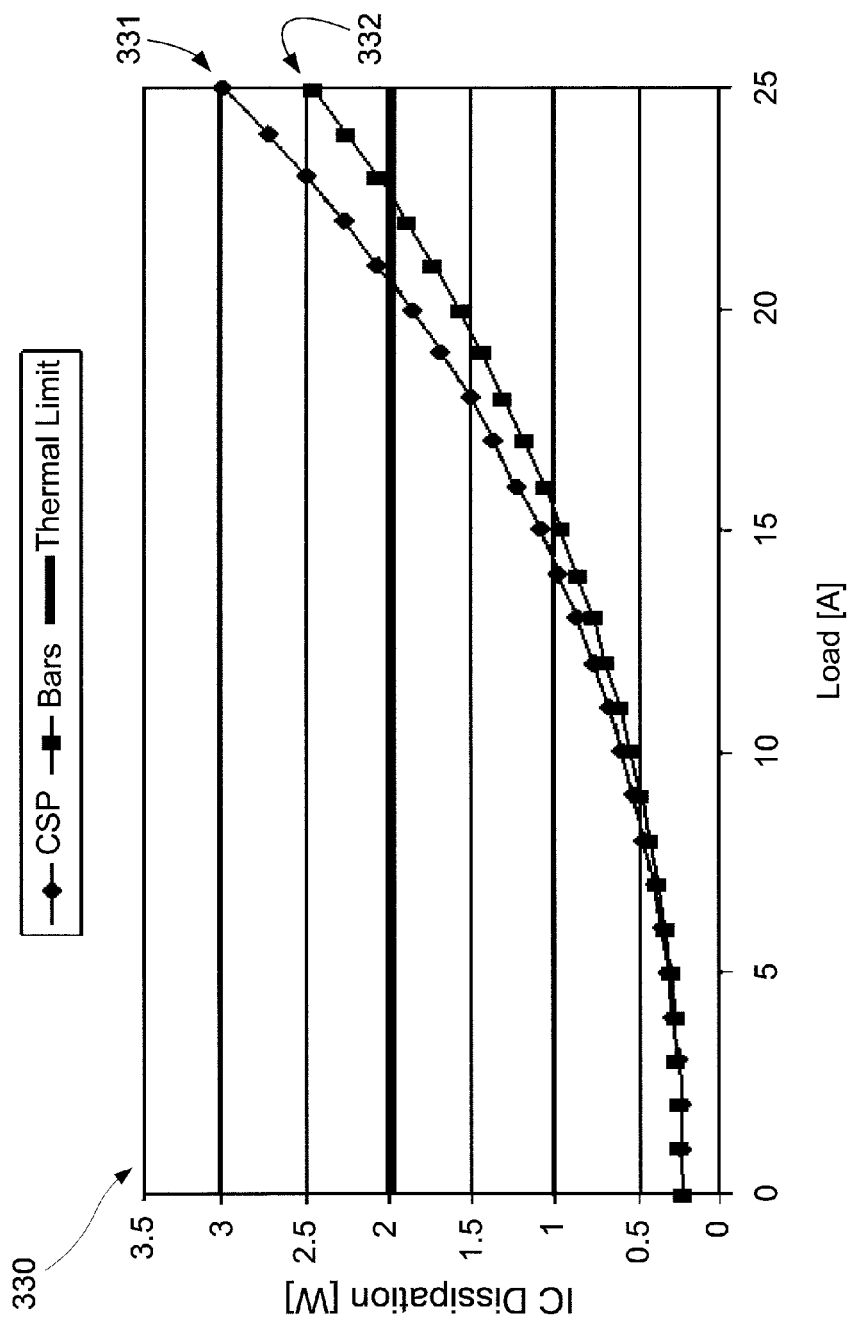
FIG. 14 shows a chart depicting the results of a power dissipation benchmark.

FIG. 14 shows chart 330 depicting comparative power dissipation benchmarks from package 2 (FIG. 1) and package 301 (FIG. 11). The power dissipation benchmark results for solder ball package 2 are represented by "CSP" line 331 and the results for solder bar package 301 are represented "Bars"

line 332. Solder bar package 301 produced a 550 mW savings at 25A and 2A more current at 2 W dissipation over solder ball package 2.

Although the foregoing discussion emphasizes the bonding of a chip scale package to a PCB, it will be appreciated that the discussion also applies to bonding between other types of components. For example, a chip-on-chip structure may be created where two wafers are subjected to the process shown in FIG. 9, one chip through the entire process and the other through step 96. It is also possible to alter process 90 where the wafer is processed through step 96 and the steps 97, 98 form the solder bar on the PCB.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A chip scale package made-ready for installation of a microchip on a printed circuit board, an interposer, or a chip-on-chip stack, comprising:
    a microchip including a switching element;
    a first solder bar electrically coupled to a first terminal of the switching element;
    a second solder bar electrically coupled to a second terminal of the switching element; and
    a plurality of additional solder bars, each of the plurality of additional solder bars configured to provide an interface with the microchip for a signal selected from the group consisting of a data signal and an input/output signal;
    wherein:
        the first solder bar comprises a plurality of first solder bars,
        the second solder bar comprises a plurality of second solder bars, and
        the plurality of first solder bars is disposed in an alternating sequence with the plurality of second solder bars.

2. A chip scale package made-ready for installation of a microchip on a printed circuit board, an interposer, or a chip-on-chip stack, comprising:
    a microchip including a switching element;
    a first solder bar electrically coupled to a first terminal of the switching element;
    a second solder bar electrically coupled to a second terminal of the switching element; and
    a plurality of additional solder bars, each of the plurality of additional solder bars configured to provide an interface with the microchip for a signal selected from the group consisting of a data signal and an input/output signal;
    wherein:
        the first solder bar comprises a plurality of first solder bars,
        the second solder bar comprises a plurality of second solder bars,
        the chip scale package comprises a plurality of third solder bars,
        each of the plurality of first solder bars is electrically coupled to a first node in the microchip, each of the plurality of second solder bars is electrically coupled to a second node in the microchip, and each of the plurality of third solder bars is electrically coupled to a third node in the microchip, each of the first, second, and third nodes being different nodes,
        a first column of solder bars includes an alternating sequence of the plurality of first solder bars and the plurality of second solder bars, and
        a second column of solder bars includes an alternating sequence of the plurality of second solder bars and the plurality of third solder bars.

3. A chip scale package made-ready for installation of a microchip on a printed circuit board, an interposer, or a chip-on-chip stack, comprising:
    a microchip;
    first and second solder bars configured to provide power circuit connections to the microchip; and
    a plurality of additional solder bars, each of the plurality of additional solder bars configured to provide an interface with the microchip for a signal selected from the group consisting of a data signal and an input/output signal;
    wherein:
        the first solder bar comprises a plurality of first solder bars,
        the second solder bar comprises a plurality of second solder bars, and
        the plurality of first solder bars is disposed in an alternating sequence with the plurality of second solder bars.

4. A chip scale package made-ready for installation of a microchip on a printed circuit board, an interposer, or a chip-on-chip stack, comprising:
    a microchip;
    first and second solder bars configured to provide power circuit connections to the microchip; and
    a plurality of additional solder bars, each of the plurality of additional solder bars configured to provide an interface with the microchip for a signal selected from the group consisting of a data signal and an input/output signal;
    wherein:
        the first solder bar comprises a plurality of first solder bars,
        the second solder bar comprises a plurality of second solder bars,
        the chip scale package comprises a plurality of third solder bars,
        each of the plurality of first solder bars is electrically coupled to a first node in the microchip, each of the plurality of second solder bars is electrically coupled to a second node in the microchip, and each of the plurality of third solder bars is electrically coupled to a third node in the microchip, each of the first, second, and third nodes being different nodes,
        a first column of solder bars includes an alternating sequence of the plurality of first solder bars and the plurality of second solder bars, and
        a second column of solder bars includes an alternating sequence of the plurality of second solder bars and the plurality of third solder bars.

5. A chip scale package made-ready for installation of a microchip on a printed circuit board, an interposer, or a chip-on-chip stack, comprising:
    a microchip including a switching element;
    a plurality of first solder bars electrically coupled to a first terminal of the switching element; and
    a plurality of second solder bars electrically coupled to a second terminal of the switching element;
    wherein:
        each first and second solder bar forms a respective surface for soldering to a bonding surface, and the plurality of first solder bars is disposed in an alternating sequence with the plurality of second solder bars.

6. The chip scale package of claim 5, wherein, for each solder bar, at least one of a width and a depth of the solder bar is at least four times greater than a height of the solder bar.

7. The chip scale package of claim 5, the wherein the switching element is a field effect transistor.

8. A chip scale package made-ready for installation of a microchip on a printed circuit board, an interposer, or a chip-on-chip stack, comprising:
- a microchip including a switching element;
- a plurality of first solder bars electrically coupled to a first terminal of the switching element;
- a plurality of second solder bars electrically coupled to a second terminal of the switching element; and
- a plurality of third solder bars;

wherein:
- each solder bar forms a respective surface for soldering to a bonding surface,
- each of the plurality of first solder bars is electrically coupled to a first node in the microchip, each of the plurality of second solder bars is electrically coupled to a second node in the microchip, and each of the plurality of third solder bars is electrically coupled to a third node in the microchip, each of the first, second, and third nodes being different nodes,
- a first column of solder bars includes an alternating sequence of the plurality of first solder bars and the plurality of second solder bars, and
- a second column of solder bars includes an alternating sequence of the plurality of second solder bars and the plurality of third solder bars.

9. The chip scale package of claim 8, wherein, for each solder bar, at least one of a width and a depth of the solder bar is at least four times greater than a height of the solder bar.

10. The chip scale package of claim 8, the wherein the switching element is a field effect transistor.

* * * * *

UNITED STATES PATENT AND TRADEMARK OFFICE
CERTIFICATE OF CORRECTION

PATENT NO. : 8,710,664 B2
APPLICATION NO. : 13/361716
DATED : April 29, 2014
INVENTOR(S) : Efren M. Lacap et al.

It is certified that error appears in the above-identified patent and that said Letters Patent is hereby corrected as shown below:

Title Page Item (57)
Abstract, Line 6, "of a solder bars" should read --of solder bars--.

In the Specification
Column 4, Line 3, "temperatures" should read --temperature--.
Column 5, Line 22, "FIG." should read --FIGS.--.
Column 9, Line 21, "there between" should read --therebetween--.

In the Claims
In Claim 7, Column 11, Line 7, "package of claim 5, the wherein the switching element" should read --package of claim 5, wherein the switching element--.
In Claim 10, Column 12, Line 17, "package of claim 8, the wherein the switching element" should read --package of claim 8, wherein the switching element--.

Signed and Sealed this
Eleventh Day of November, 2014

Michelle K. Lee
*Deputy Director of the United States Patent and Trademark Office*